United States Patent
Hsu et al.

(10) Patent No.: US 11,251,801 B2
(45) Date of Patent: Feb. 15, 2022

(54) FREQUENCY ADJUSTING APPARATUS AND FREQUENCY ADJUSTING METHOD

(71) Applicant: Realtek Semiconductor Corporation, Hsinchu (TW)

(72) Inventors: Chih-Hsiung Hsu, Zhubei (TW); Gerchih Chou, San Jose, CA (US); Han-Chieh Hsieh, Hsinchu (TW)

(73) Assignee: REALTEK SEMICONDUCTOR CORPORATION, Hsinchu (TW)

(*) Notice: Subject to any disclaimer, the term of this patent is extended or adjusted under 35 U.S.C. 154(b) by 114 days.

(21) Appl. No.: 16/679,466

(22) Filed: Nov. 11, 2019

(65) Prior Publication Data

US 2021/0143826 A1    May 13, 2021

(51) Int. Cl.
| | |
|---|---|
| H03L 7/23 | (2006.01) |
| G06F 1/08 | (2006.01) |
| H03L 7/097 | (2006.01) |
| H03L 7/24 | (2006.01) |

(52) U.S. Cl.
CPC ............. *H03L 7/23* (2013.01); *G06F 1/08* (2013.01); *H03L 7/097* (2013.01); *H03L 7/24* (2013.01)

(58) Field of Classification Search
CPC . H03L 7/085; H03L 7/097; H03L 7/16; H03L 7/22; H03L 7/23; H03L 7/24; G06F 1/04; G06F 1/08
See application file for complete search history.

(56) References Cited

U.S. PATENT DOCUMENTS

| | | | | |
|---|---|---|---|---|
| 2012/0249192 A1* | 10/2012 | Matsushita | ............... | G06F 1/08 327/115 |
| 2013/0147526 A1* | 6/2013 | Kim | ....................... | H03K 21/10 327/115 |
| 2015/0323967 A1* | 11/2015 | Aoyagi | ................... | G06F 1/324 327/540 |

FOREIGN PATENT DOCUMENTS

| | | |
|---|---|---|
| TW | I243979 B | 11/2005 |
| TW | I627832 B | 6/2018 |

* cited by examiner

*Primary Examiner* — Diana J. Cheng
(74) *Attorney, Agent, or Firm* — Locke Lord LLP; Tim Tingkang Xia, Esq.

(57) ABSTRACT

A frequency adjusting apparatus used in a processing chip operated at an operation frequency according to a power is provided that includes a clock supplying circuit, a frequency division circuit and a control circuit. The clock supplying circuit outputs one of clock signals as a supplied clock signal. The frequency division circuit performs frequency division on the supplied clock signal according to a parameter to generate an output clock signal. The control circuit determines a combination of a selected clock signal and a value of the parameter for gradually increasing the frequency of the output clock signal during the increasing of the voltage value that passes through voltage value sections, wherein when the voltage value is determined to be larger than a second threshold value and when the voltage value sections correspond to higher voltage values, the selected clock signal has a higher frequency.

14 Claims, 3 Drawing Sheets

FREQUENCY ADJUSTING APPARATUS AND FREQUENCY ADJUSTING METHOD

BACKGROUND

Field of Invention

The present invention relates to a frequency adjusting technology. More particularly, the present invention relates to a frequency adjusting apparatus and a frequency adjusting method.

Description of Related Art

A processor of a system-on-a-chip (SoC) may execute heavy-loaded procedure such that an instant voltage drop occurs. The timing of the processor is thus insufficient and may cause the failure of the processor. In some technologies, the clock frequency is rapidly decreased when the voltage drop is detected to decrease the power dissipation of the circuit such that the voltage value can be restored. However, the restoring of the frequency should match the restoring of the voltage value. Otherwise, either the voltage value cannot afford the increasing of the frequency or the operation efficiency of the processor is affected.

Accordingly, what is needed is a frequency adjusting apparatus and a frequency adjusting method to address the issues mentioned above.

SUMMARY

An aspect of the present invention is to provide an apparatus capable for use in a processing chip operated at an operation frequency according to a power. The frequency adjusting apparatus includes a clock supplying circuit, a frequency division circuit and a control circuit. The clock supplying circuit is configured to select and output one of a plurality of clock signals as a supplied clock signal. The frequency division circuit is configured to perform frequency division on the supplied clock signal according to a parameter to generate an output clock signal. The control circuit is configured to determine a combination of a selected clock signal from the clock signals and a value of the parameter for: lowering a frequency of the output clock signal when a voltage value of the power is lower than a first threshold value; gradually increasing the frequency of the output clock signal during the increasing of the voltage value that passes through a plurality of voltage value sections, wherein when the voltage value is determined to be larger than a second threshold value and when the voltage value sections correspond to higher voltage values, the selected clock signal has a higher frequency; and controlling the output clock signal to have the operation frequency when the voltage value is restored to an operation voltage value.

Another aspect of the present invention is to provide a method capable for use in a frequency adjusting apparatus used in a processing chip operated at an operation frequency according to a power. The method includes the steps outlined below. One of a plurality of clock signals is selected and outputted as a supplied clock signal by a clock supplying circuit. Frequency division is performed on the supplied clock signal according to a parameter to generate an output clock signal by a frequency division circuit. A combination of a selected clock signal from the clock signals and a value of the parameter is determined by a control circuit for: lowering a frequency of the output clock signal when a voltage value of the power is lower than a first threshold value; gradually increasing the frequency of the output clock signal during the increasing of the voltage value that passes through a plurality of voltage value sections, wherein when the voltage value is determined to be larger than a second threshold value and when the voltage value sections correspond to higher voltage values, the selected clock signal has a higher frequency; and controlling the output clock signal to have the operation frequency when the voltage value is restored to an operation voltage value.

These and other features, aspects, and advantages of the present invention will become better understood with reference to the following description and appended claims.

It is to be understood that both the foregoing general description and the following detailed description are by examples, and are intended to provide further explanation of the invention as claimed.

BRIEF DESCRIPTION OF THE DRAWINGS

The invention can be more fully understood by reading the following detailed description of the embodiment, with reference made to the accompanying drawings as follows.

DETAILED DESCRIPTION

Figure 1:
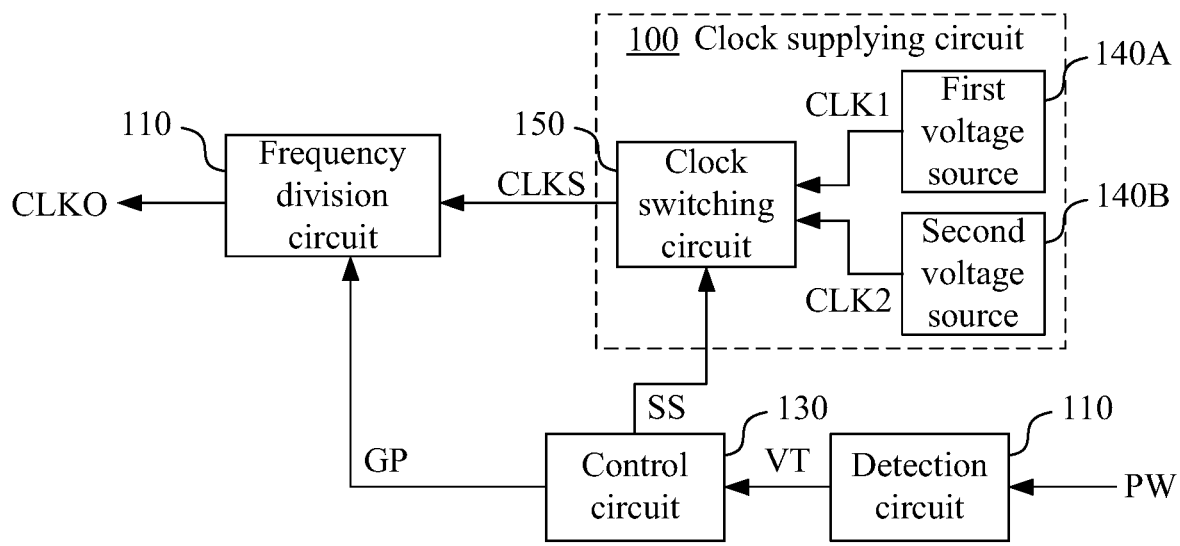
FIG. 1 is a block diagram of a frequency adjusting apparatus in an embodiment of the present invention.

Reference will now be made in detail to the present embodiments of the disclosure, examples of which are illustrated in the accompanying drawings. Wherever possible, the same reference numbers are used in the drawings and the description to refer to the same or like parts.

Reference is made to FIG. 1. FIG. 1 is a block diagram of a frequency adjusting apparatus 1 in an embodiment of the present invention. In an embodiment, the frequency adjusting apparatus 1 is disposed in a processing chip (not illustrated). The processing chip is operated at an operation frequency according to a power PW. The frequency adjusting apparatus 1 includes a clock supplying circuit 100, a frequency division circuit 110, a detection circuit 120 and a control circuit 130.

The clock supplying circuit 100 is configured to select and output one of a plurality of clock signals as a supplied clock signal CLKS.

In an embodiment, the clock supplying circuit 100 includes a first clock source 140A, a second clock source 140B and a clock switching circuit 150.

The first clock source 140A is configured to generate a first clock signal CLK1 having the operation frequency. The second clock source 140B is configured to generate a second clock signal CLK2 having a frequency lower than the operation frequency. In an embodiment, the frequency of the first clock signal CLK1 can be 1.5 GHz. The frequency of the second clock signal CLK2 can be 1 GHz.

The clock switching circuit 150 is configured to select one of the first and the second clock signals 140A and 140B as the supplied clock signal CLKS. In an embodiment, the clock switching circuit 150 can perform selection according to such as, but not limited to a selection signal SS.

The frequency division circuit 110 is electrically coupled to the clock supplying circuit 100 and is configured to perform frequency division on the supplied clock signal CLKS according to a parameter GP to generate an output clock signal CLKO. In an embodiment, the frequency division circuit 110 performs frequency division by gating the supplied clock signal CLKS according to the parameter GP to generate the output clock signal CLKO, in which the parameter GP is a gating parameter.

In an actual implementation example, the frequency division circuit 110 is a gate-control circuit to gate target parts of the clock signal. The parameter GP is a digital control code having a plurality of digits. For example, the parameter GP can be implemented by an 8-bit digital control code such that the adjustment can be performed digit by digit to control the number of the positive edges of the supplied clock signal CLKS within a time period to approximate a certain clock frequency.

In a numerical example, when the parameter GP is (01010101), the effective frequency of output clock signal CLKO can be controlled to be 50% of the frequency of supplied clock signal CLKS. When the parameter GP is (01110111), the effective frequency of output clock signal CLKO can be controlled to be 75% of the frequency of supplied clock signal CLKS. When the parameter GP is (11111111), the frequency of output clock signal CLKO can be controlled to be 100% of supplied clock signal CLKS. By using such a method, the frequency division circuit 110 can perform an approximation of frequency-increasing and frequency-lowering effect to generate a frequency-adjusted output clock signal CLKO.

The detection circuit 120 is configured to detect the voltage value VT of the power PW. The control circuit 130 is electrically coupled to the clock supplying circuit 100, the frequency division circuit 110 and the detection circuit 120 and is configured to receive the detected voltage value VT to control the operation of the clock supplying circuit 100 and the frequency division circuit 110 accordingly.

More specifically, according to the voltage value VT, the control circuit 130 generates the selection signal SS to control the clock supplying circuit 100 to select one of the first and the second clock signals 140A and 140B as the supplied clock signal CLKS, and generates the parameter GP to control the gating operation of the frequency division circuit 110 to perform frequency division on the supplied clock signal CLKS to generate the output clock signal CLKO.

Figure 2:
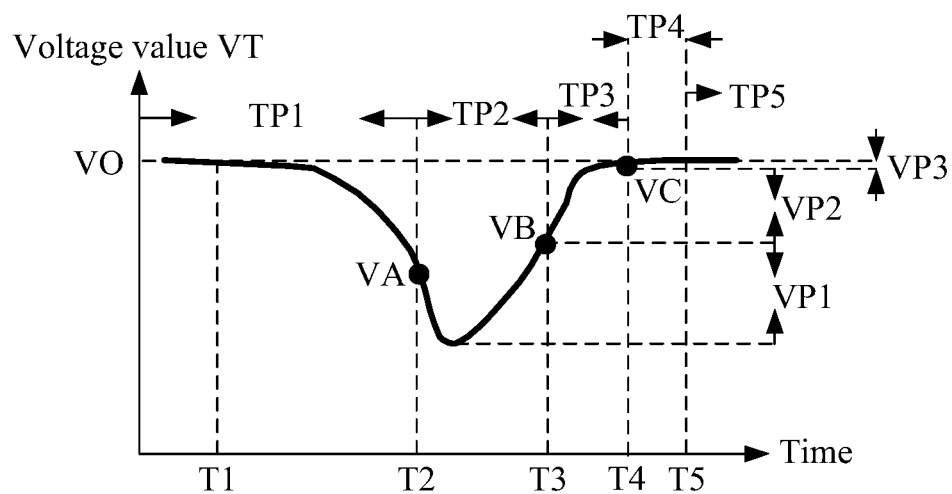
FIG. 2 is a diagram of a waveform of the voltage value relative to the change of time in an embodiment of the present invention.

The control mechanism of the control circuit 130 is described in detail in accompany with FIG. 2.

Reference is now made to FIG. 2. FIG. 2 is a diagram of a waveform of the voltage value VT relative to the change of time in an embodiment of the present invention. In FIG. 2, the X-axis illustrates the change of time and the Y-axis illustrates the voltage value VT.

In a time period TP1, when the voltage value VT is at an operation voltage value VO, the control circuit 130 controls the clock supplying circuit 100 to select the first clock signal CLK1 as the supplied clock signal CLKS and controls the parameter GP to not gate the supplied clock signal CLKS (e.g. by using the parameter GP (11111111)). As a result, the output clock signal CLKO is identical to the first clock signal CLK1 and has the operation frequency.

At a time spot T1 in the time period TP1, the voltage value VT of the power PW is decreased rapidly due to an instant large dissipation of the power PW caused by such as, but not limited to a heavy-loaded procedure is executed by the processing chip or other factors.

At the time spot T2, the voltage value VT is smaller than a threshold value VA. Under such a condition, the control circuit 130 still controls the clock supplying circuit 100 to select the first clock signal CLK1 as the supplied clock signal CLKS and controls the parameter GP to perform frequency division to lower the frequency of the output clock signal CLKO.

Subsequently, in a time period TP2 after the time spot T2, the control circuit 130 still controls the clock supplying circuit 100 to select the first clock signal CLK1 as the supplied clock signal CLKS and controls the parameter GP to gradually increase the frequency of the output clock signal CLKO when the voltage value VT is increased. As illustrated in FIG. 2, the increasing of the voltage value VT begins when the voltage value VT reaches a lowest value.

At a time spot T3 at the end of the time period TP2, the increasing of the voltage value VT passes through a voltage value section VP1 to reach a threshold value VB and enters a next voltage value section VP2.

In a time period TP3 after the time spot T3, the control circuit 130 controls the clock supplying circuit 100 to select the second clock signal CLK2 as the supplied clock signal CLKS and controls the parameter GP to gradually increase the frequency of the output clock signal CLKO during the increasing of the voltage value VT.

At a time spot T4 at the end of the time period TP3, the increasing of the voltage value VT passes through the voltage value section VP2 to reach a threshold value VC and enters a next voltage value section VP3.

In a time period TP4 after the time spot T4, the control circuit 130 controls the clock supplying circuit 100 to select the first clock signal CLK1 as the supplied clock signal CLKS and controls the parameter GP to gradually increase the frequency of the output clock signal CLKO during the increasing of the voltage value VT.

At a time spot T5 at the end of the time period TP4, the increasing of the voltage value VT passes through the voltage value section VP3 to reach the operation voltage value VO.

In a time period TP5 after the time spot T5, the control circuit 130 controls the clock supplying circuit 100 to select the first clock signal CLK1 as the supplied clock signal CLKS and controls the parameter GP to not gate the supplied clock signal CLKS. As a result, the output clock signal CLKO is identical to the first clock signal CLK1 and has the operation frequency.

As a result, after the voltage value VT is increased to be larger than the threshold value VB, the selected clock signal has a higher frequency when the voltage value sections correspond to higher voltage values.

More specifically, in the present embodiment, after the voltage value VT is increased to be larger than the threshold value VB, the control circuit 130 first selects the second clock signal CLK2 having a lower frequency to gradually increase the frequency of the output clock signal CLKO by using the parameter GP. When the voltage value VT reaches a higher voltage value section, the control circuit 130 selects the first clock signal CLK1 having a higher frequency to gradually increase the frequency of the output clock signal CLKO by using the parameter GP.

Since the frequency division circuit 110 performs frequency adjusting by using the gating mechanism, the closest two positive edges of an adjusted clock signal may be distanced by one time period when the parameter (01110111) is used in accompany with the supplied clock signal CLKS having the higher frequency (e.g. the first clock signal CLK1). When the frequency is increased before the voltage value VT reaches the operation voltage VO, the power PW with such a voltage value VT may not be able to provide sufficient timing due to the condition described above and may cause the processing chip to fail. On the other hand, when the frequency is increased after the voltage value VT reaches the operation voltage VO, the increasing of the frequency is too slow to affect the operation efficiency.

The frequency adjusting apparatus 1 of the present invention can use different combinations of the clock signals and the parameter such that the clock signals having a higher frequency can be used to increase the frequency of the output clock signal when the voltage value VT becomes higher. Under such a condition, the increasing of the frequency can become smoother and is able to reach the operation frequency when the voltage value VT reaches the operation voltage value VO without affect the efficiency of the processing chip.

It is appreciated that the embodiment described above uses two clock signals to be selected as an example. In other embodiment, more clock signals can be used. Further, the number of the digits of the parameter GP can be values other than 8, e.g. 16.

Figure 3:
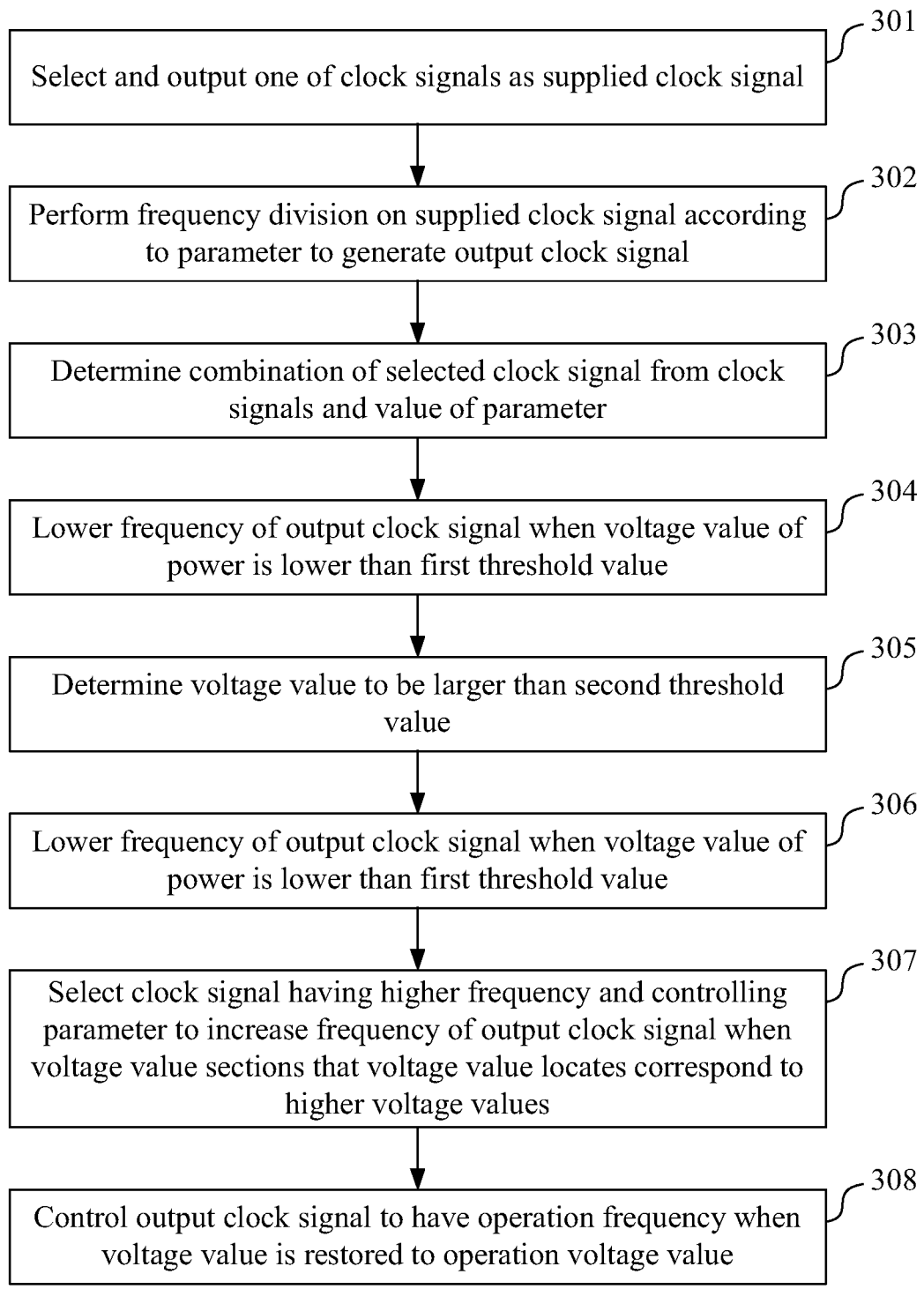
FIG. 3 is a flowchart of a frequency adjusting method in an embodiment of the present invention.

FIG. 3 is a flowchart of a frequency adjusting method 300 in an embodiment of the present invention. The frequency adjusting method 300 can be used in the frequency adjusting apparatus 1 illustrated in FIG. 1. The frequency adjusting method 300 includes the operations outlined below (The operations are not recited in the sequence in which the operations are performed. That is, unless the sequence of the operations is expressly indicated, the sequence of the operations is interchangeable, and all or part of the steps may be simultaneously, partially simultaneously, or sequentially performed).

In step 301, one of the clock signals, e.g. the first clock signal CLK1 and the second clock signal CLK2, is selected and outputted as the supplied clock signal CLKS by the clock supplying circuit 100.

In step 302, frequency division on the supplied clock signal CLKS is performed according to the parameter GP to generate the output clock signal CLKO by the frequency division circuit 110.

In step 303, the combination of a selected clock signal from the clock signals and a value of the parameter is determined by the control circuit 130.

In step 304, the frequency of the output clock signal CLKO is lowered when the voltage value VT of the power PW is lower than the first threshold value VA.

In step 305, the voltage value VT is determined to be larger than the second threshold value.

In step 307, when the voltage value sections that the voltage value VT locates correspond to higher voltage values, the clock signal selected by the clock supplying circuit 100 has a higher frequency and the parameter GP is controlled to increase the frequency of the output clock signal CLKO.

In step 308, the output clock signal CLKO is controlled to have the operation frequency when the voltage value CT is restored to the operation voltage value VO.

Figure 4:
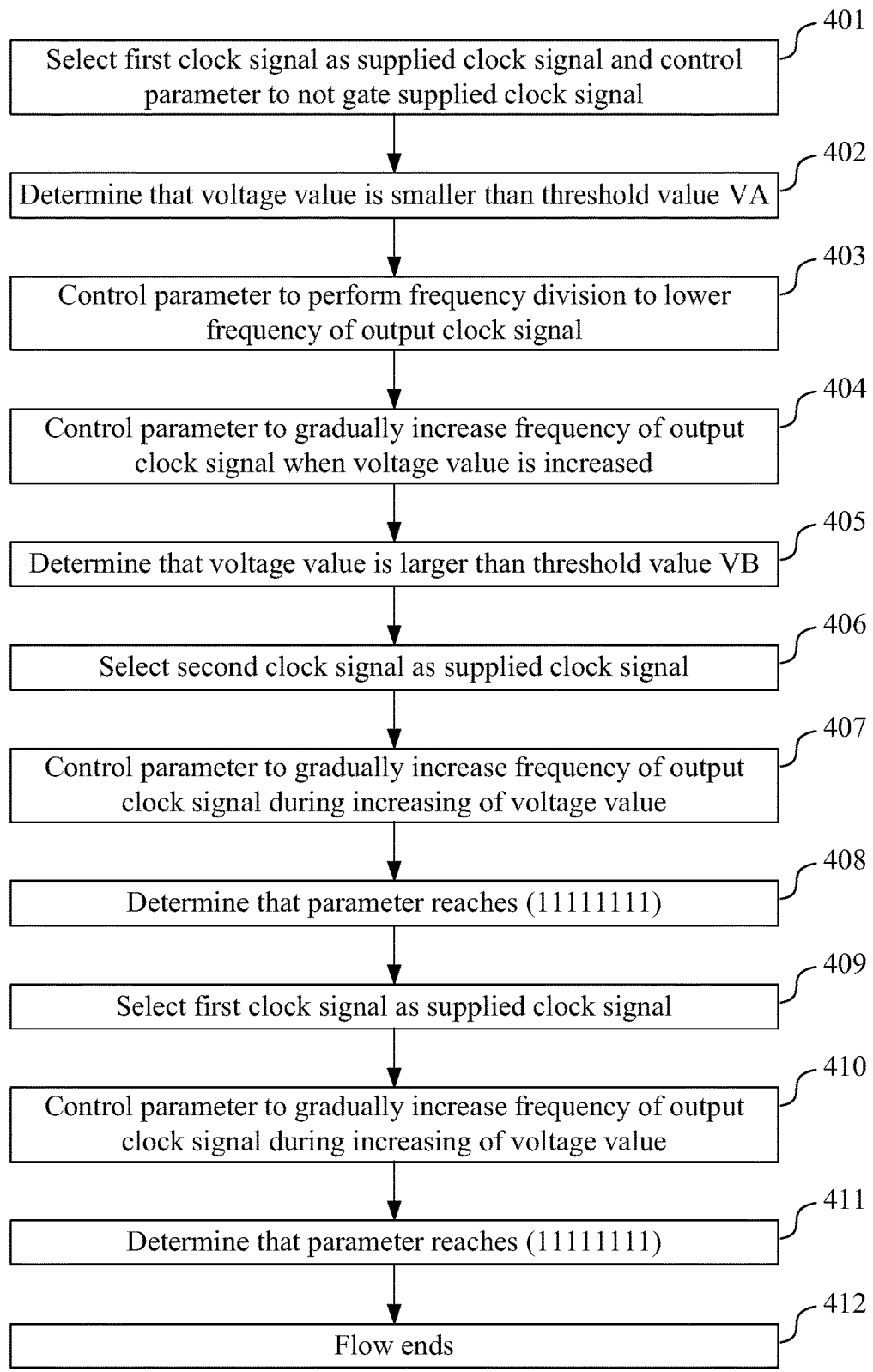
FIG. 4 is a flowchart of a frequency adjusting method in an embodiment of the present invention.

FIG. 4 is a flowchart of a frequency adjusting method 400 in an embodiment of the present invention. The frequency adjusting method 400 can be used in the frequency adjusting apparatus 1 illustrated in FIG. 1. In the present embodiment, two clock signals, e.g. the first clock signal CLK1 and the second clock signal CLK2 illustrated in FIG. 1, are used as an example to perform description in accompany with the increasing of the voltage value VT in FIG. 3.

The frequency adjusting method 400 includes the operations outlined below (The operations are not recited in the sequence in which the operations are performed. That is, unless the sequence of the operations is expressly indicated, the sequence of the operations is interchangeable, and all or part of the steps may be simultaneously, partially simultaneously, or sequentially performed).

In step 401, the control circuit 130 controls the clock supplying circuit 100 to select the first clock signal CLK1 as the supplied clock signal CLKS and controls the parameter GP to not gate the supplied clock signal CLKS. As a result, the output clock signal CLKO is identical to the first clock signal CLK1 and has the operation frequency.

In step 402, the control circuit 130 determines that the voltage value VT is smaller than the threshold value VA.

In step 403, the control circuit 130 controls the parameter GP to perform frequency division to lower the frequency of the output clock signal CLKO.

In step 404, the control circuit 130 controls the parameter GP to gradually increase the frequency of the output clock signal CLKO when the voltage value VT is increased.

In step 405, the control circuit 130 determines that the voltage value VT is larger than the threshold value VB.

In step 406, the control circuit 130 controls the clock supplying circuit 100 to select the second clock signal CLK2 as the supplied clock signal CLKS.

In step 407, the control circuit 130 controls the parameter GP to gradually increase the frequency of the output clock signal CLKO during the increasing of the voltage value VT.

In step 408, the control circuit 130 determines that the parameter reaches (11111111), while the voltage value VT reaches the threshold value VC.

In step 409, the control circuit 130 controls the clock supplying circuit 100 to select the first clock signal CLK1 as the supplied clock signal CLKS.

In step 410, the control circuit 130 controls the parameter GP to gradually increase the frequency of the output clock signal CLKO during the increasing of the voltage value VT.

In step 411, the control circuit 130 determines that the parameter reaches (11111111), while the voltage value VT reaches the operation voltage value VO.

In step 412, the flow ends.

It will be apparent to those skilled in the art that various modifications and variations can be made to the structure of the present invention without departing from the scope or spirit of the invention. In view of the foregoing, it is intended that the present invention cover modifications and variations of this invention provided they fall within the scope of the following claims.

What is claimed is:

1. An apparatus capable for use in a processing chip operated at an operation frequency according to a power, comprising:
 a clock supplying circuit configured to select and output one of a plurality of clock signals as a supplied clock signal;
 a frequency division circuit configured to perform frequency division on the supplied clock signal according to a parameter to generate an output clock signal; and
 a control circuit configured to determine a combination of a selected clock signal from the clock signals and a value of the parameter for:
 during decreasing of a voltage value of the power that passes through a plurality of voltage value sections, lowering a frequency of the output clock signal when the voltage value of the power is lower than a first threshold value;

during increasing of the voltage value of the power that passes through the plurality of voltage value sections, gradually increasing the frequency of the output clock signal; and controlling the clock supplying circuit to select the first clock signal as the supplied clock signal and controlling the parameter to not gate the first clock signal such that the output clock signal has the operation frequency when the voltage value is restored to an operation voltage value, wherein the first threshold value is less than the operation voltage value.

2. The apparatus of claim 1, wherein the clock signals comprise a first clock signal having the operation frequency and a second clock signal having a frequency lower than the operation frequency, the control circuit is further configured to:

controlling the clock supplying circuit to select the first clock signal as the supplied clock signal and controlling the parameter to lower the frequency of the output clock signal first when the voltage value is lower than the first threshold value;

gradually increasing the frequency of the output clock signal when the voltage value is increased; and controlling the clock supplying circuit to select the second clock signal as the supplied clock signal and controlling the parameter to gradually increasing the frequency of the output clock signal when the voltage value is increased to a first voltage section having the voltage values larger than the second threshold.

3. The apparatus of claim 2, wherein the control circuit is further configured to:

controlling the clock supplying circuit to select the first clock signal as the supplied clock signal and controlling the parameter to gradually increasing the frequency of the output clock signal when the voltage value is increased to a second voltage section having the voltage values larger than the first voltage section but lower than the operation voltage value.

4. The apparatus of claim 2, wherein the clock supplying circuit comprises:

a first clock source configured to generate the first clock signal;

a second clock source configured to generate the second clock signal; and a clock switching circuit configured to select one of the first and the second clock signals as the supplied clock signal based on the control of the control circuit.

5. The apparatus of claim 1, further comprising a detection circuit configured to detect the voltage value of the power.

6. The apparatus of claim 1, wherein the parameter is a gating parameter including a digital control code that has a plurality of digits.

7. The apparatus of claim 1, wherein the frequency division circuit performs frequency division by gating the supplied clock signal according to the parameter to generate the output clock signal.

8. A method capable for use in a frequency adjusting apparatus used in a processing chip operated at an operation frequency according to a power, comprising:

selecting and outputting one of a plurality of clock signals as a supplied clock signal by a clock supplying circuit;

performing frequency division on the supplied clock signal according to a parameter to generate an output clock signal by a frequency division circuit;

determining a combination of a selected clock signal from the clock signals and a value of the parameter by a control circuit for:

during decreasing of a voltage value of the power that passes through a plurality of voltage value sections, lowering a frequency of the output clock signal when the voltage value of the power is lower than a first threshold value;

during increasing of the voltage value of the power that passes through the plurality of voltage value sections, gradually increasing the frequency of the output clock signal; and controlling the clock supplying circuit to select the first clock signal as the supplied clock signal and controlling the parameter to not gate the first clock signal such that the output clock signal has the operation frequency when the voltage value is restored to an operation voltage value, wherein the first threshold value is less than the operation voltage value.

9. The method of claim 8, wherein the clock signals comprise a first clock signal having the operation frequency and a second clock signal having a frequency lower than the operation frequency, the method further comprises:

controlling the clock supplying circuit to select the first clock signal as the supplied clock signal and controlling the parameter to lower the frequency of the output clock signal first when the voltage value is lower than the first threshold value;

gradually increasing the frequency of the output clock signal when the voltage value is increased; and controlling the clock supplying circuit to select the second clock signal as the supplied clock signal and controlling the parameter to gradually increasing the frequency of the output clock signal when the voltage value is increased to a first voltage section having the voltage values larger than the second threshold.

10. The method of claim 9, further comprising:

controlling the clock supplying circuit to select the first clock signal as the supplied clock signal and controlling the parameter to gradually increasing the frequency of the output clock signal when the voltage value is increased to a second voltage section having the voltage values larger than the first voltage section but lower than the operation voltage value.

11. The method of claim 9, further comprising:

generating the first clock signal by a first clock source of the clock supplying circuit;

generating the second clock signal by a second clock source of the clock supplying circuit; and selecting one of the first and the second clock signals as the supplied clock signal by a clock switching circuit of the clock supplying circuit based on the control of the control circuit.

12. The method of claim 8, further comprising:

detecting the voltage value of the power by a detection circuit.

13. The method of claim 8, wherein the parameter is a gating parameter including a digital control code that has a plurality of digits.

14. The method of claim 8, wherein the frequency division circuit performs frequency division by gating the supplied clock signal according to the parameter to generate the output clock signal.

* * * * *